United States Patent
Nakamura et al.

(12) 
(10) Patent No.: US 6,376,609 B2
(45) Date of Patent: Apr. 23, 2002

(54) PHOTOSENSITIVE RESIN AND PHOTOSENSITIVE RESIN COMPOSITION CONTAINING THE SAME

(75) Inventors: Shigeo Nakamura; Tadahiko Yokota, both of Kawasaki (JP)

(73) Assignee: Ajinomoto Co., Inc., Tokyo (JP)

( * ) Notice: Subject to any disclaimer, the term of this patent is extended or adjusted under 35 U.S.C. 154(b) by 0 days.

(21) Appl. No.: 09/782,256

(22) Filed: Feb. 14, 2001

Related U.S. Application Data

(62) Division of application No. 08/927,086, filed on Sep. 10, 1997, now Pat. No. 6,221,972, which is a continuation of application No. 08/575,400, filed on Dec. 20, 1995, now abandoned.

(30) Foreign Application Priority Data

Dec. 20, 1994 (JP) .............................................. 6-316189

(51) Int. Cl.$^7$ .......................... G03F 7/028; G09D 11/10; G09D 163/00; C08J 3/28; C08L 63/00
(52) U.S. Cl. ................. 525/131; 430/280.1; 430/287.1; 430/283.1; 430/285.1; 522/149; 522/97; 522/99; 525/327.3; 525/293; 525/301; 525/452; 525/131; 525/454; 525/479
(58) Field of Search .............................. 525/327.3, 293, 525/301, 452, 131, 454, 479; 522/149, 97, 99

(56) References Cited

U.S. PATENT DOCUMENTS

| | | | |
|---|---|---|---|
| 2,687,404 A | | 8/1954 | Robertson ................. 525/373.3 |
| 2,831,830 A | | 4/1958 | Schroeder ................. 525/327.3 |
| 3,530,100 A | * | 9/1970 | D'Alelio ..................... 260/78.4 |
| 4,020,030 A | | 4/1977 | Harris et al. ................ 260/29.2 |
| 4,039,414 A | * | 8/1977 | McGinniss ................... 522/149 |
| 4,220,704 A | * | 9/1980 | Etoh et al. ................... 522/149 |
| 4,338,232 A | | 7/1982 | Harris et al. ................. 525/531 |
| 4,565,859 A | * | 1/1986 | Murai et al. ................. 525/281 |
| 5,128,232 A | | 7/1992 | Thackeray et al. ...... 430/270.1 |

FOREIGN PATENT DOCUMENTS

JP      5-127378 A      5/1993

OTHER PUBLICATIONS

CA 108:122063, Chemical Abstract of Japanese Koka: JP. 62–226101 A2 and Registry Number Identification of 25086–25–3. Date of Original Document Abstracted Oct. 5, 1987.

\* cited by examiner

*Primary Examiner*—Cynthia Hamilton
(74) *Attorney, Agent, or Firm*—Oblon, Spivak, McClelland, Maier & Neustadt, P.C.

(57) ABSTRACT

The present invention relates to a novel photosensitive resin which can be developed in water and which can be used as a photosensitive resin composition. More specifically, the present invention relates to a composition which is useful as a photosensitive soldering resist for printed circuit board.

5 Claims, No Drawings

PHOTOSENSITIVE RESIN AND PHOTOSENSITIVE RESIN COMPOSITION CONTAINING THE SAME

This application is a divisional of application Ser. No. 08/927,086, filed on Sep. 10, 1997, now U.S. Pat. No. 6,221,972 which is a continuation of application Ser. No. 08/575,400, filed on Dec. 20, 1995 now abandoned.

BACKGROUND OF THE INVENTION

1. Field of the Invention

The present invention relates to a novel photosensitive resin which can be developed in water and which can be used as a photosensitive resin composition. More specifically, the present invention relates to a composition which is useful as a photosensitive soldering resist for printed circuit board.

2. Discussion of the Background

Soldering resists are used to prevent troubles when soldering parts onto a printed circuit board and to protect the circuit board having parts mounted thereon for a long period of time. However, in recent years, as the size of electronic appliances has decreased, the density of the printed circuit board has increased as parts are mounted on the surface. To allow for the higher density of the printed circuit board, the resist has been changed from a screen-printing-type resist to a photographic printing-type resist.

Alkaline aqueous solutions are mainly used for developing photographic-printing-type resists because they improve the working environment and protect the environment. A photosensitive soldering resist which can be developed in alkali is described in Japanese Patent Publication No. 54,390/1989. Therein, a photo-setting or thermosetting liquid resist ink composition comprising an actinic light-curable resin obtained by reacting a reaction product of a novolak type epoxy compound and an unsaturated monocarboxylic acid with a saturated or unsaturated polybasic acid anhydride, a photopolymerization initiator, a diluent and an epoxy compound is disclosed. Although the properties as the soldering resist are satisfactory, when the coating is conducted through spray coating or curtain coating, dilution with a large amount of an organic solvent is required, posing problems such as environmental pollution, ignition and the like. Accordingly, an improvement has been in high demand.

Japanese Laid-Open Patent Application (Kokai) Nos. 120,308/1990 and 157,965/1994 disclose a soldering resist ink composition which is obtained by using an alicyclic epoxy compound as a starting material and which can be developed with an alkaline aqueous solution. However, since this composition is developed with a dilute alkaline aqueous solution, it is necessary not only to prepare a developer and control a concentration thereof but also to neutralize the fatigue developer. Further, the alkali ion component of the developer remains in the resist coated film, which seems to pose a problem with electrical characteristics. For this reason, it is indispensable to conduct a water-washing step after the development step.

In order to solve these problems, liquid photosensitive soldering resists which can be diluted in water and/or can be developed in water have been proposed.

For example, Japanese Laid-Open Patent Application (Kokai) No. 294,352 discloses a photosensitive resin composition which is formed by reacting an aromatic epoxy resin with an unsaturated monocarboxylic acid, then reacting the reaction mixture with an unsaturated polybasic acid anhydride, and then neutralizing the reaction product with amine, a thermosetting compound, a photopolymerization initiator and a reactive diluent. Japanese Laid-Open Patent Application (Kokai) No. 294,354/1992 discloses a photosensitive oligomer obtained by neutralizing with amine a reaction product of a copolymer of a (meth)acrylate ester and (meth)acrylic acid with an epoxy group-containing (meth)acrylate ester, a photopolymerization initiator and a reactive diluent. These compositions can be diluted with water, but involve problems in that a dilute alkaline aqueous solution is required in the development, the amine used in the neutralization is vaporized in the drying step used to obtain a tack-free film, and decreased developing occurs in this step.

U.S. Pat. Nos. 3,697,398, 3,936,405 and 3,962,165 disclose a cationic electrodeposition coating comprising an epoxy resin and an onium compound such as a quaternary ammonium salt, a tertiary sulfonium salt and a quaternary phosphonium salt.

U.S. Pat. No. 4,338,232 discloses epoxy resin derivatives containing a photosensitive group and a tertiary sulfonium salt. Japanese Laid-Open Patent Application (Kokai) No. 1,858/1990 discloses that analogous aromatic epoxy resin derivatives are used in a photosensitive soldering resist which can be diluted and developed in water. In such aromatic epoxy resins, a phenolic hydroxyl group of a phenolic novolak resin or a cresol novolak resin is reacted with epichlorohydrin under alkaline conditions, so that impurities such as sodium and chlorine tend to remain in the epoxy resin product.

When aromatic epoxy resin derivatives are used as main components in a photosensitive soldering resist, the aromatic ring absorbs ultraviolet light or the like used in the exposure step. When this occurs, permeation of actinic light is poor, and the energy is not effectively utilized in the photo-setting. Accordingly, an exposure amount of more than approximately 300 mJ/cm$^2$ is required in a photosensitive soldering resist. A photosensitive soldering resist which can be used in a printed circuit board having a fine pattern is required to have excellent heat resistance, excellent resistance to plating and high levels of electrical characteristics. None of existing products have satisfied these requirements.

SUMMARY OF THE INVENTION

Accordingly, one object of the present invention is to provide a photosensitive soldering resist composition which can be diluted and developed in water and has excellent properties as a soldering resist.

The present inventors have assiduously conducted investigations to solve the above-mentioned problems. They have focused on an alicyclic epoxy resin which is free from impurities such as sodium and chlorine and which has excellent electrical characteristics, excellent heat resistance and low absorption of an actinic light. They have discovered a photosensitive soldering resist composition which the above properties which comprises:

(A) (1) a tertiary sulfonium group-containing photosensitive resin which is obtained by reacting 1 epoxy equivalent of an alicyclic epoxy resin of the formula (I)

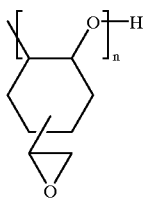

wherein n is a positive integer, and wherein said resin has a molecular weight of from 500 to 300,000 with (a) x-equivalent (0<x≦1) of an unsaturated monocarboxylic acid, (b) (1−x) equivalent of a saturated monocarboxylic acid and (c) y-equivalent (0<y≦1) of a sulfide compound of the formula (II)

$R^1$—S—$R^2$ wherein $R^1$ and $R^2$ may be the same of different and each represents an alkyl group having from 1 to 8 carbon atoms with or without a substituent group selected from the group consisting of a hydroxyl group, an alkoxy group or an ester group, or an alkenyl group having from 1 to 8 carbon atoms with or without a substituent group selected from the group consisting of a hydroxyl group, an alkoxy group or an ester group, (2) a quaternary ammonium salt-containing photosensitive resin which is obtained by reacting 1 epoxy equivalent of an alicyclic epoxy resin of the formula (I)

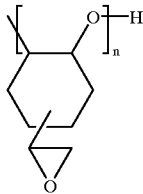

wherein n is a positive integer, and wherein said resin has a molecular weight of from 500 to 300,000 with z equivalent (0<z<1) of an unsaturated monocarboxylic acid, and reacting the residual epoxy group of the thus-obtained compound with (1−z) equivalent of an unsaturated and/or saturated monocarboxylic acid, and (1−z) equivalent of a tertiary amine compound of the formula (III)

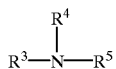

$R^3$—N—$R^5$
  |
  $R^4$ wherein $R^3$, $R^4$, and $R^5$ may be the same or different and each represents an alkyl group having from 1 to 8 carbon atoms withour without a substituent group selected from the group consisting of a hydroxyl group, an alkoxy group or an ester group, or an alkenyl group having from 1 to 8 carbon atoms with or without a substituent group selected from the group consisting of a hydroxyl group, an alkoxy group or an ester group, (3) a mixture of (1) and (2); and (B) a photopolymerization initiator.

DETAILED DESCRIPTION OF THE PREFERRED EMBODIMENTS

The present invention is characterized in that the properties of the photosensitive soldering resist are greatly improved by using an epoxy resin in which a part or all of hydroxyl groups of an alicyclic epoxy resin represented by formula (I) are crosslink-modified with a polyisocyanate compound and/or a compound having at least two silanol groups or alkoxysilyl groups. The respective components are specifically described below.

The alicyclic epoxy resin represented by formula (I), a starting material of the component (A) in the composition of the present invention, is obtained by polymerizing 4-vinylcyclohexene oxide through ring-opening using an appropriate alcohol as a polymerization initiator and epoxylating a vinyl group in the side chain. 4-vinylcyclohexene oxide is commercially available as EHPE-3150 from Daicel Chemical Industries, Ltd.

Further, the epoxy resin obtained by reacting the above-mentioned alicyclic epoxy resin with the compound having at least two isocyanate groups such that a ratio of isocyanate equivalent to hydroxyl equivalent of the alicyclic epoxy resin is not more than 1.0 can be used as a starting material of the component (A).

Examples of compounds having at least two isocyanate groups include tolylene diisocyanate, hexamethylene diisocyanate, isophorone diisocyanate, trimers of these, methylenebisphenyl isocyanate, and polymethylenepolyphenyl polyisocyanate.

The reaction of the alicyclic epoxy resin with the compound having at least two isocyanate groups can be conducted in an organic solvent at a temperature of from 40 to 100° C. in the presence of a tertiary amine or an organotin compound as a catalyst in a usual manner. Examples of the organic solvent include ketones such as methyl ethyl ketone, aromatic hydrocarbons such as toluene and tetramethylbenzene, esters such as acetate esters of ethyl acetate and glycol ethers (methyl cellosolve and methylcarbitol), aliphatic hydrocarbons such as octane, and petroleum solvents such as petroleum naphtha and solvent naphtha.

Alternatively, an epoxy resin obtained by reacting the alicyclic epoxy resin with a compound having at least two silanol groups or alkoxysilyl groups such that a ratio of silanol or alkoxysilyl equivalent to hydroxyl equivalent of the alicyclic epoxy resin is not more than 1.0 can also be used as a starting material of the component (A).

Examples of the compound having at least two silanol groups or alkoxysilyl groups include silicone varnishes for modification such as ER211 to 217 made by The Shin-etsu Chemical Industry Co., Ltd., and SH6018 silicone resin intermediates of Toray-Dow Corning-Silicone K.K.

The reaction alicyclic epoxy resin with a compound having at least two silanol groups can be conducted for from 3 to 15 hours through heating at from 120 to 180° C. in the presence of an organic titanate compound as a catalyst, and the reaction mixture is condensed through dehydration or removal of alcohol.

One equivalent of the epoxy group is reacted with x-equivalent (0<x≦1) of an unsaturated monocarboxylic acid, (1−x) equivalent of a saturated monocarboxylic acid and y-equivalent (0<y≦1) of a sulfide compound of the formula (II), whereby the polymerizable unsaturated group and the water-soluble tertiary sulfonium salt can be introduced into the above-mentioned alicyclic epoxy resin. It is possible to conduct the reaction simultaneously or to first react a part of the epoxy groups with the unsaturated or saturated carboxylic acid and then introduce the onium salt therein. The reaction is conducted through heating at from 50 to 85° C., and is completed in from 2 to 30 hours.

Examples of the unsaturated monocarboxylic acid used include acrylic acid, methacrylic acid, crotonic acid, cinnamic acid and acrylamide-N-glycolic acid. Acrylic acid is especially preferable. Of the monocarboxylic acids which are reacted with an equivalent amount of the epoxy group of the alicyclic epoxy resin, the unsaturated monocarboxylic acid is used preferably in an amount of from 0.2 to 1 equivalent from the standpoint of the photo-setting property.

Examples of the saturated monocarboxylic acid which may be used jointly with the unsaturated monocarboxylic acid include known compounds such as acetic acid, formic acid, glycolic acid, lactic acid and propionic acid.

The remaining epoxy group of the compound obtained by the reaction of 1 equivalent of the epoxy group with z-equivalent (0<z<1) of the unsaturated monocarboxylic acid is reacted with (1−z) equivalent of the monocarboxylic acid and (1−z) equivalent of the tertiary amino compound represented by formula (III), whereby the polymerizable unsaturated group and the quaternary ammonium salt can be introduced into the alicyclic epoxy resin.

The reaction for the introduction of the onium salt is carried out after the completion of the reaction with the unsaturated monocarboxylic acid because the reaction can easily be controlled. When the epoxy resin is first reacted with the unsaturated monocarboxylic acid, the reaction is conducted for from 2 to 12 hours through heating at from 80 to 120° C. in the presence of a catalyst such as triphenylphosphine or dimethylbenzylamine.

Examples of the unsaturated monocarboxylic acid are the same as those mentioned above, and acrylic acid is especially preferable. The reaction of introducing the onium salt can be conducted under the same conditions as the reaction of introducing the tertiary sulfonium salt.

The sulfide compound and the tertiary amine compound which are reacted simultaneously with the monocarboxylic acid to form the onium salt structure are not particularly limited unless substantially inhibiting formation of the onium salt.

These compounds are represented by formula (II) and (III). In the formulas, wherein $R^1$, $R^2$, $R^3$, $R^4$ and $R^5$ may be the same or different and each represents alkyl group having from 1 to 8 carbon atoms with or without a substituent group selected from the group consisting of a hydroxyl group, an alkoxy group or an ester group, or an alkenyl group having from 1 to 8 carbon atoms with or without a substituent group selected from the group consisting of a hydroxyl group, an alkoxy group or an ester group and $R^3$, $R^4$ and $R^5$ may be the same or different.

The onium salt is introduced at a ratio sufficient to water-solubilize the photosensitive resin. The optimum range of this ratio can be determined depending on the water-solubility of the sulfide compound or the tertiary amine compound and the monocarboxylic acid used. The amount of the sulfide compound or the tertiary amine compound used in the reaction is less than the epoxy equivalent of the alicyclic epoxy resin, and it is preferably between 0.1 and 0.8 equivalent.

It is advisable that the reaction for formation of the above-mentioned photosensitive resin be conducted in an organic solvent. Examples of the solvent include ketones such as methyl ethyl ketone, aromatic hydrocarbons such as toluene and tetramethylbenzene, glycol ethers such as methyl cellosolve, methylcarbitol and triethylene glycol monoethyl ether, esters such as acetate esters of ethyl acetate and the above-mentioned glycol ethers , alcohols such as ethylene glycol and propylene glycol, aliphatic hydrocarbons such as octane, and petroleum solvents such as petroleum naphtha and solvent naphtha. These may be used either singly or in combination. The amount of the solvent used is preferably between 5 and 400 parts by weight per 100 parts by weight of the photosensitive resin.

Examples of the photopolymerization initiator (B) used in the present invention include:

benzoins and benzoin alkyl ethers such as benzoin, benzyl, benzoin methyl ether and benzoin isopropyl ether, acetophenones such as acetophenone, 2,2-dimethoxy-2-phenylacetophenone, 2,2-diethoxy-2-phenylacetophenone, 1,1-dichloroacetophenone, 1-hydroxycyclohexyl phenyl ketone, 2-methyl-1-(4 (methylthio)phenyl]-2-morphono-propan-1-one and N,N-dimethylaminoacetophenone, anthraquinones such as 2-methylanthraquinone, 2-ethylanthraquinone, 2-tert-butylanthraquinone, 1-chloroanthraquinone, 2-amylanthraquinone and 2-aminoanthraquinone, thioxanethones such as 2,4-dimethylthioxanethone, 2,4-diethylthioxanethone, 2-chlorothioxanethone and 2,4-diisopropylthioxanethone, ketals such as acetophenonedimethylketal and benzyldimethylketal, benzophenones such as benzophonone, methylbenzophenone, 4,4,-dichlorobenzophenone, 4,4,1-bisdiethylaminobenzophenone and Michler's ketone, and xanthones.

These initiators can be used either singly or in combination. Further, a known sensitizer may be used in such a photopolymerization initiator.

Examples of the sensitizer include benzoate esters such as ethyl triethylamine and triethanolamine. These sensitizers may be used either singly or in combination.

The amount of the photopolymerization initiator used is between 0.2 and 30 parts by weight, preferably between 2 and 20 parts by weight per 100 parts by weight of the photosensitive resin (A). When the amount is less than the above-mentioned range, the sensitivity becomes poor. When it is more than the above-mentioned range, no improvement in the sensitivity is expected.

Further, a known heat radical generator can be used. Examples thereof include peroxides such as benzoyl peroxide, and azo compounds such as azobisisobutyronitrile.

In the preparation of the solder-resist ink of the present invention, a diluent can be used in addition to the above-mentioned essential components. As the diluent, an organic solvent and/or water and/or a photopolymerizable vinyl monomer can be used. Examples of the organic solvent are the same as those which are used in the reaction for formation of the photosensitive resin. Examples of the photopolymerizable vinyl monomer include acrylamides, acrylates and methacrylates. These reactive diluents, especially the polyfunctional acrylates are used to improve the sensitivity of the soldering resist ink composition. Such diluents may be used either singly or in combination. The amount of the diluent used is preferably between 5 and 250 part by weight per 100 parts by weight of the photosensitive resin (A).

The composition of the present invention may further contain a thermosetting resin. Examples of the thermosetting resin include an epoxy resin, a malamine resin and a blocked isocyanate. The amount of the thermosetting resin is preferably between 0 and 60% by weight of the composition. At this time, a curing agent of the thermosetting resin can be used.

Still further, other known additives can be used in the present invention. Such additives include inorganic fillers, coloring agents, heat polymerization inhibitors, thickening agents, defoamers and/or leveling agents, and adhesion imparting agents.

Known examples of the inorganic filler include barium sulfate, barium, titanate, silicon oxide powder, finely divided silicon oxide, amorphous silica, talc, clay, magnesium carbonate, calcium carbonate, aluminum oxide, aluminum hydroxide and mica powder. The amount of the inorganic filler is between 0 and 100% by weight, preferably between 5 and 60% by weight of the resin composition.

Examples of the coloring agent include phthalocyanine blue, phthalocyanine green, iodine green, disazo yellow, crystal violet, titanium oxide, carbon black and naphthalene black.

Examples of the heat polymerization inhibitor include hydroquinone, hydroquinone monomethyl ether and phenothiazine.

Examples of the thickening agent include asbestos, olben and benton.

Examples of the defoamer and/or the leveling agent include silicone compounds, fluorine compounds and high-molecular compounds.

Examples of the adhesion imparting agent include imidazoles, thiazoles, and a silane coupling agent.

The soldering resist composition of the present invention can be prepared by fully mixing the components (A) and (B) and optionally additives such as a diluent (C), a thermosetting resin, (D) or an additive (E) such as a filler, a pigment, a thixotropic agent and the like by means of an appropriate device such as a triple roll mill, a ball mill or the like. A coated film is formed by coating such a soldering resist composition on the overall surface of, for example, a printed circuit board through screen printing or by means of a curtain coater, a spin coater, a spray or the like. Subsequently, the coated film is exposed by direct irradiation with laser beam or selectively to an actinic light of a high pressure arc mercury lamp, a metal halide lamp or the like through a photomask having a pattern formed thereon, and an unexposed portion is developed with water to form a pattern. The amount of the actinic light absorbed in the photosensitive resin of the present invention is small, and permeability is high. Accordingly, the satisfactory photo-setting can be conducted using an exposure amount of an actinic light (UV light or the like) of from 50 to 200 mJ/cm$^2$ which is relatively small as a soldering resist. Therefore, the exposure step is shortened, which leads to improvement in the amount of the product.

After the completion of the development, the heat treatment is conducted at from 100 to 200° C., and the post-exposure is carried out as required, making it possible to obtain a permanent protective film that satisfies the properties as the soldering resist.

Since water can be used as a developer, it is quite effective from the standpoint of control and environment as mentioned above. Further, since jigs used to coat the resist ink can be washed with city water, it is quite desirable in view of working environment.

The composition of the present invention is especially useful as a soldering resist composition. It can also be used as a plating resist, insulation materials, surface coating agents, paints, adhesives and the like.

EXAMPLES

Having generally described this invention, a further understanding can be obtained by reference to certain specific Production Examples, Examples and Comparative Examples which are provided herein for purposes of illustration only and are not intended to be limiting unless otherwise specified. In these Examples, "parts" and "%" are by weight unless otherwise instructed.

Production Example 1

A reaction vessel fitted with a condenser, a stirrer and a thermometer was charged with 178 parts of an alicyclic epoxy resin EHPE-3150 (made by Daicel Chemical industries, Ltd.; epoxy equivalent—178, amount of hydrolyzable chlorine—1 ppm or less) and 115 parts of methylcarbitol, and these were heat-stirred at 90° C., and dissolved. Subsequently, 57 parts of acrylic acid, 0.1 parts of hydroquinone and 0.7 parts of dimethylbenzylamine were added thereto, and the mixture was reacted at 110° C. for 4 hours while being stirred to obtain epoxyacrylate. Then, this reaction product was cooled to 70° C. and 18 parts of dimethylaminoethanol and 15 parts of acrylic acid were added thereto. The mixture was heat-stirred for 12 hours to give 384 parts of a resin solution having a non-volatile content of 70%.

Production Example 2

A reaction vessel fitted with a condenser, a stirrer and a thermometer was charged with 100 parts of an alicyclic epoxy resin EHPE-3150 and 46 parts of carbitol acetate, and these were heat-stirred at 90° C., and dissolved. Subsequently, the reaction temperature was lowered to 70° C., and 7 parts of 2,4-tolylene duisocyanate and 0.01 parts of dibutyltin dilaurate were added dropwise to this solution. The mixture was heat-stirred for 3 hours to obtain 153 parts of an isocyanate-modified epoxy resin. Then, 40 parts of acrylic acid, 0.1 parts of hydroquinone, 24 parts of thiodiethanol and 27 parts of methylcarbitol were further added thereto at the same temperature, and the mixture was heat-stirred for 24 hours to give 244 parts of a resin solution having a non-volatile content of 70%.

Production Example 3

A reaction vessel fitted with a condenser, a stirrer and an inert gas blowing device was charged with 100 parts of an alicyclic epoxy resin EHPE-3150 (epoxy equivalent—178) and 15 parts of silicone varnish KR213 for modification by The Shin-etsu Chemical Industry Co., Ltd.; methoxy equivalent—160). The mixture was heat-stirred at 170° C. for 1 hours while passing a nitrogen gas to remove methanol vaporized. Subsequently, the temperature was lowered to 100° C., and 45 parts of carbitol acetate were added thereto to obtain 157 parts of a silicone-modified epoxy resin solution. Then, 28 parts of acrylic acid, 0.1 parts of hydroquinone and 0.3 parts of dimethylbenzylamine were added thereto, and the mixture was reacted at 110° C. for 4 hours to form epoxyacrylate. Thereafter, the temperature was lowered to 70° C., and 23 parts of 2-(N,N-dimethylamino) ethyl acrylate, 12 parts of acrylic acid and 30 parts of methylcarbitol were further added thereto. The mixture was heat-stirred for 12 hours to give 250 parts of a resin composition having a nonvolatile content of 70%.

Comparative Production Example 1

A reaction vessel fitted with a condenser, a stirrer and a thermometer was charged with 224 parts of a cresol novolak-type epoxy resin (epoxy equivalent—224, amount of hydrolyzable chlorine—120 ppm) and 170 parts of methylcarbitol. The mixture was heat-stirred at 100° C., and dissolved. Then, 51 parts of acrylic acid, 0.1 parts of hydroquinone and 0.7 parts of dimethylbenzylamine were added thereto, and the mixture was reacted at 110° C. for 6 hours while being stirred to obtain epoxyacrylate. Subsequently, this reaction product was cooled to 70° C., and 27 parts of dimethylaminoethanol and 18 parts of acetic acid were added thereto. The mixture was heat-stirred for 12 hours to give 491 parts of a resin solution having a non-volatile content of 65%.

Comparative Production Example 2

A reaction vessel fitted with a condenser, a stirrer and a thermometer was charged with 224 parts of a cresol novolak-type epoxy resin (epoxy equivalent—224) and 148 parts of methylcarbitol. The mixture was heat-stirred at 100° C., and dissolved. Then, 72 parts of acrylic acid, 0.1 parts of hydroquinone and 50 parts of thiodiethanol were added thereto, and the mixture was heat-stirred for 24 hours to give 494 parts of a resin solution having a non-volatile content of 70%.

Example 1

| component | parts |
| --- | --- |
| resin solution obtained in Production Example 1 | 45 |
| 2-methyl-1-[4-(methylthio) phenyl]-2-morphonopropan-1-one | 3.2 |
| diethylthioxanthone | 0.5 |
| barium sulfate | 18 |
| aerosil | 1.2 |
| phthalocyanine green | 0.5 |
| silicone-type defoamer | 1 |

The above-mentioned components were preliminarily kneaded, and then further kneaded three times by means of a triple roll mill to prepare a soldering resist composition. This soldering resist composition was coated on the overall surface of a 20-μm-thick print substrate through screen printing to form a test piece.

Example 2

| component | parts |
| --- | --- |
| resin solution obtained in Production Example 2 | 45 |
| SP-4060 (novolak-type epoxyacrylate made by Showa Kobunshi K.K. | 5 |
| 2-methyl-1-[4-(methylthio)phenyl]-2-morphonopropan-1-one | 3.2 |
| diethylthioxanthone | 0.5 |
| barium sulfate | 12 |
| silica | 6 |
| aerosil | 1.2 |
| phthalocyanine green | 0.5 |
| silicone-type defoamer | 1 |

In the same manner as in Example 1, the above-mentioned components were kneaded and coated to form a test piece.

Example 3

| component | parts |
| --- | --- |
| resin solution obtained in Production Example 3 | 45 |
| dipentaerythritol hexaacrylate | 2 |
| Cymel 303 (methylated melamine made by Mitsui Cyanamid K.K.) | 5 |
| 2-methyl-1-[4-(methylthio)phenyl]-2-morphonopropan-1-one | 3.2 |
| diethylthioxanthone | 0.5 |
| barium sulfate | 12 |
| talc | 6 |
| aerosil | 2 |
| phthalocyanine green | 5 |
| silicone-type defoamer | 1 |

In the same manner as.in Example 1, the above-mentioned components were kneaded and coated to form a test piece.

Comparative Example 1

| component | parts |
| --- | --- |
| resin solution obtained in Comparative Production Example 1 | 50 |
| 2-methyl-1-[4-(methylthio) phenyl]-2-morphonopropan-1-one | 3.2 |
| diethylthioxanthone | 0.5 |
| barium sulfate | 18 |
| aerosil | 1.2 |
| phthalocyanine green | 0.5 |
| silicone-type defoamer | 1 |

In the same manner as in Example 1, the above-mentioned components were kneaded and coated to form a test piece.

Comparative Example 2

| component | parts |
| --- | --- |
| resin solution obtained in Comparative Production Example 2 | 45 |
| SP-4060 (novolak-type epoxyacrylate made by Showa Kobunshi K.K.) | 5 |
| 2-methyl-1-[4-(methylthio)phenyl]-2-morphonopropan-1-one | 3.2 |
| diethylthioxanthone | 0.5 |
| barium sulfate | 12 |
| silica | 6 |
| aerosil | 1.2 |
| phthalocyanine green | 0.5 |
| silicone-type defoamer | 1 |

In the same manner as in Example 1, the above-mentioned components were kneaded and coated to form a test piece.

The resin solutions obtained in Production Examples 1 to 3 and Comparative Production Examples-1 and 2 and the resin compositions obtained in Example 2 and Comparative Example 2 were measured for ultraviolet light permeability 1) mentioned below.

1) Measurement of Ultraviolet Light Permeability:

Each of the resin solutions and the resin compositions was coated on a polyethylene terephthalate film to a dry film thickness of 20 μm, and an ultraviolet light was irradiated from the film side using a metal halide lamp manufactured by Oak Seisakusho. The amount of the ultraviolet light permeated through the film was measured using a ultraviolet actinometer having a wavelength of from 320 to 390 nm (peak wavelength sensitivity 360 nm). The measured value was divided by the value obtained from the original film. The permeability was indicated by %.

The test pieces obtained in Examples 1 to 3 and Comparative Examples 1 and 2 were measured for the following properties 2) to 9).

2) Test for Tack-Free Property:

Each of the test pieces was put into a hot air oven, dried at 75° C. for 20 minutes, and then cooled to room temperature. The coated film was touched by a finger, and the tack of the coated film was evaluated according to the following grades.

○: No tack is observed.

Δ: A finger print is slightly left.

×: An ink is adhered to the finger.

3) Test for Photo-Setting Property:

After the completion of the drying step, a photomask having formed thereon a pattern including 21 steps of a stuffer step guide was brought into contact with the surface of the coated film, and was exposed to an ultraviolet light in exposure amounts of 150 and 500 mJ/cm$^2$ using a metal halide lamp manufactured by Oak Seisakusho. Then, the development was conducted under hydraulic -pressure of 2 kg/cm$^2$ using water of 30° C. as a developer. The remaining sensitivity of the exposed portion was indicated in terms of the number of steps.

4) Test for Adhesion:

After the completion of the above-mentioned development step, the resulting film was put into a hot air oven heated at 150° C., and was post-cured for 30 minutes to form a test piece. The test for adhesion was conducted as follows. That is, according to the test method of JIS D 0202, the test piece was crosscut, and peeled off by means of a cellophane tape. Thereafter, the number of the crosscuts peeled off was counted. The adhesion was evaluated based on the number of the crosscuts peeled off.

○: 100/100

Δ: 50/100 to 99/100

×: 0/100 to 49/100

5) Test for Pencil Hardness:

Each of the same test pieces as those used in the test for adhesion was measured for pencil hardness according to the test method of JIS K 5400.

6) Test for Resistance to Soldering:

According to the test method of JIS C 6481, each of the same test pieces as those used in the test for adhesion was dipped in a soldering bath of 260° C. for 15 seconds, and this dipping was repeated until abnormal phenomena such as solder creep, blister and the like occurred on the coated film. The number of the dippings was then counted.

7) Test for Resistance to Nickel Plating:

Each of the same test pieces as those used in the test for adhesion was plated at a liquid temperature of 85° C. for 30 minutes using a non-electrolytic nickel plating solution, ICP Nickolon made by Okuno Seiyaku Kogyo K.K. Then, the condition of the coated film and the adhesion thereof were evaluated in combination.

○: The coated film is not changed at all.

Δ: The coated film is slightly changed.

×: The coated film is blistered or blistered and dropped

8) Test for Insulation Resistance:

Test pieces were prepared under the same conditions as those employed in the test for adhesion using a combed electrode of IPC-SM-840B B-25 test coupon. A voltage of 100 11 was applied thereto for I minute, and the insulation resistance at that time was measured.

9) Test for Electrolytic Corrosion:

Test pieces were prepared under the same conditions as those employed in the test for adhesion using d combed electrode of IPC-SM-840B B-25 test Coupon. A voltage of 100 V was applied thereto at a temperature of 85° C. and a humidity of 85% for 500 hours. Then, discoloration of the coated film was observed.

The resin solutions obtained in Production Examples 1 to 3 and Comparative Production Examples 1 and 2 and the resin compositions obtained in Example 2 and Comparative Example 2 were measured for ultraviolet light permeability. The results are shown in Table 1.

TABLE 1

| | Production Examples | | | Example | Comparative Production Examples | | Comparative |
|---|---|---|---|---|---|---|---|
| | 1 | 2 | 3 | 2 | 1 | 2 | Example 2 |
| Permeability (%) | 91 | 88 | 78 | 12 | 61 | 59 | 2 |

It is clear from the above table that the photosensitive resin and the resin composition of the present invention have excellent ultraviolet light permeability. This is because the photosensitive resin of the present invention is, unlike the aromatic epoxy resin derivatives in Comparative Example, composed mainly of the alicyclic structure and the absorption of the ultraviolet light is therefore decreased. It results in the superior photo-setting property.

The test pieces obtained in Examples 1 and 3 and Comparative Example 1 were subjected to the above-mentioned tests 2) to 8), and the test pieces obtained in Example 2 and Comparative Example 2 to the above-mentioned tests 2) to 9), respectively. The results are shown in Table 2.

TABLE 2

| | Examples | | | | | |
|---|---|---|---|---|---|---|
| | 1 | | 2 | | 3 | |
| Tack-free property | 0 | | 0 | | 0 | |
| Exposure amount (mJ/cm$^2$) | 150 | 500 | 150 | 500 | 150 | 500 |
| Photo-setting property (number of steps) | 6 | 10 | 7 | 11 | 6 | 9 |
| Adhesion | ○ | ○ | ○ | ○ | ○ | ○ |
| Pencil hardness | 4H | 5H | 5H | 5H | 4H | 5H |
| Resistance to soldering (number of dippings) | 3 | 4 | 6 | 6 | 6 | 6 |
| Resistance to nickel soldering | Δ | Δ | ○ | ○ | ○ | ○ |
| Insulation resistance | 1E + 13 | 1E + 13 | 3E + 13 | 4E + 13 | 3E + 13 | 5E + 13 |

TABLE 2-continued

| | Examples | |
|---|---|---|
| (Ω) Discoloration after electrolytic corrosion test | No | No |

| | Comparative Examples | | | |
|---|---|---|---|---|
| | 1 | | 2 | |
| Tack-free property | ○ | | ○ | |
| Exposure amount (mJ/cm²) | 150 | 500 | 150 | 500 |
| Photo-setting property (number of steps) | 3 | 6 | 3 | 7 |
| Adhesion | Δ | ○ | ○ | ○ |
| Pencil hardness | 4H | 4H | 4H | 4H |
| Resistance to soldering (number of dippings) | 1 | 1 | 2 | 3 |
| Resistance to nickel soldering | x | x | x | Δ |
| Insulation resistance (Ω) | 2E + 12 | 5E + 12 | 5E + 12 | 7E + 12 |
| Discoloration after electrolytic corrosion test | | | Yes | Yes |

It is clear from the above-mentioned table that the soldering resist composition of the present invention is excellent in terms of the photo-setting property and the properties of the cured product. Further, when using the alicyclic epoxy resin modified with polyisocyanate or silicone as in Examples 2 and 3, the properties are improved as a whole. Still further, the soldering resist composition of the present invention exhibits sufficient properties with the small exposure amount, which results in shortening the exposure step, namely, improving the amount of the product. Meanwhile, in the composition using the aromatic epoxy resin as in Comparative Examples 1 and 2, the photo-setting property is 3 steps with the exposure amount of 150 mJ/cm² which is not within the practical range. With respect to the properties of the cured product, the resistance to soldering and the resistance to nickel soldering are not satisfactory. Since the product contains impurities such as sodium and chlorine, the electrical characteristics are poor, which poses serious problems in the higher density of the printed circuit board.

As shown above, the soldering resist composition containing the photosensitive resin in the present invention exhibits excellent photo-setting property and can be developed with water. Further, the cured product thereof is excellent in terms of the resistance to soldering, the resistance to nickel plating and the electrical characteristics. Still further, the soldering resist composition of the present invention can be diluted with water, which is quite significant in view of the environmental problem.

This application is based on Japanese application 316189/1994, filed on Dec. 20, 1994. The full text of that Japanese application is incorporated herein by reference.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A quaternary ammonium salt-containing photosensitive resin which is obtained by reacting a starting epoxy resin selected from the group consisting of (1) an alicyclic epoxy resin of the formula (I):

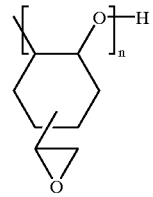

wherein n is a positive integer and wherein said alicyclic epoxy resin has a molecular weight of from 500 to 300,000, (2) an epoxy resin obtained by reacting the alicyclic epoxy resin of formula (I) having the molecular weight of from 500 to 300,000 with a compound having at least two isocyanate groups such that the ratio of isocyanate equivalents to hydroxyl equivalents of the alicyclic epoxy resin is not more than 1.0, and (3) an epoxy resin obtained by reacting the alicyclic epoxy resin of formula (I) having the molecular weight of from 500 to 300,000 with a compound having at least two silanol groups or alkoxysilyl groups such that the ratio of silanol or alkoxysilyl equivalents to hydroxyl equivalents of the alicyclic epoxy resin is not more than 1.0, with, per each epoxy equivalent of the starting epoxy resin z equivalents (0<z<1) of an unsaturated monocarboxylic acid, and reacting the residual epoxy group of the thus-obtained compound with (1-z) equivalents of an unsaturated and/or saturated monocarboxylic acid, and (1-z) equivalents of a tertiary amine compound represented by formula (III):

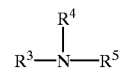

wherein $R^3$, $R^4$ and $R^5$ each, independently, are an alkyl group having from 1 to 8 carbon atoms and optionally substituted by a hydroxyl group, an alkoxy or an ester group, or an alkenyl group having from 1 to 8 carbon atoms and optionally substituted by a hydroxy group, an alkoxy or an ester group, where the number of equivalents of a monocarboxylic acid is the number of equivalents of —COOH groups in the acid and the number of equivalents of the tertiary amine compound is the number of tertiary amine equivalents present in the compound.

2. The quaternary ammonium salt-containing photosensitive resin of claim 1, wherein the starting epoxy resin is epoxy resin (1).

3. The quaternary ammonium salt-containing photosensitive resin of claim 1, wherein the starting epoxy resin is epoxy resin (2).

4. The quaternary ammonium salt-containing photosensitive resin of claim 1, wherein the starting epoxy resin is epoxy resin (3).

5. The quaternary ammonium salt-containing photosensitive resin of claim 1, wherein (1-z) is 0.1 to 0.8.

* * * * *

UNITED STATES PATENT AND TRADEMARK OFFICE
CERTIFICATE OF CORRECTION

PATENT NO. : 6,376,609 B2
DATED : April 23, 2002
INVENTOR(S) : Shigeo Nakamura et al.

It is certified that error appears in the above-identified patent and that said Letters Patent is hereby corrected as shown below:

Column 3,
Line 19, "same of" should read -- same or --;
Line 55, "withour" should read -- with or --.

Column 8,
Line 31, "duisocyanate" should read -- diisocyanate --.

Column 10,
Line 18, "as.in" should read -- as in --;
Line 60, "Examples-1" should read -- Examples 1 --.

Signed and Sealed this

Fourteenth Day of January, 2003

JAMES E. ROGAN
*Director of the United States Patent and Trademark Office*